US009954098B1

(12) United States Patent
Chang

(10) Patent No.: US 9,954,098 B1
(45) Date of Patent: Apr. 24, 2018

(54) SEMICONDUCTOR STRUCTURE AND METHOD OF MANUFACTURING THE SAME

(71) Applicant: MACRONIX International Co., Ltd., Hsinchu (TW)

(72) Inventor: Yu-Jui Chang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/498,375

(22) Filed: Apr. 26, 2017

(51) Int. Cl.
| H01L 29/78 | (2006.01) |
| H01L 29/10 | (2006.01) |
| H01L 29/06 | (2006.01) |
| H01L 29/66 | (2006.01) |
| H01L 21/225 | (2006.01) |
| H01L 21/265 | (2006.01) |
| H01L 21/266 | (2006.01) |

(52) U.S. Cl.
CPC ...... *H01L 29/7816* (2013.01); *H01L 21/2253* (2013.01); *H01L 21/266* (2013.01); *H01L 21/26513* (2013.01); *H01L 29/0615* (2013.01); *H01L 29/1079* (2013.01); *H01L 29/1095* (2013.01); *H01L 29/66681* (2013.01)

(58) Field of Classification Search
CPC .................................................. H01L 29/7816
USPC .......................................................... 257/343
See application file for complete search history.

(56) References Cited

U.S. PATENT DOCUMENTS

| 6,399,468 B2 * | 6/2002 | Nishibe | H01L 29/6659 257/E21.417 |
| 8,067,289 B2 * | 11/2011 | Park, II | H01L 29/7838 257/296 |
| 2008/0061400 A1 | 3/2008 | Williams et al. | |
| 2012/0329221 A1 | 12/2012 | Ito | |
| 2014/0225192 A1 | 8/2014 | Lee et al. | |
| 2015/0214360 A1 | 7/2015 | Kim | |
| 2016/0163691 A1 | 6/2016 | Edwards et al. | |

* cited by examiner

*Primary Examiner* — Mark Prenty
(74) *Attorney, Agent, or Firm* — J.C. Patents

(57) ABSTRACT

A semiconductor structure and a method of manufacturing the semiconductor structure are provided. The semiconductor structure includes at least a substrate, an isolated structure, a gate, a source, a drain, a deep well, and a body well. The deep well extends under the isolated structure, and the body well is formed in the deep well between the gate and the isolated structure, wherein the body well has a convex region extending under the isolated structure. The deep well has a drive-in region outside the convex region of the body well, and the drive-in region has a lower doping concentration than remainder of the deep well.

11 Claims, 10 Drawing Sheets

SEMICONDUCTOR STRUCTURE AND METHOD OF MANUFACTURING THE SAME

BACKGROUND OF THE INVENTION

1. Field of the Invention

The present invention relates to a semiconductor technique; in particular, to a semiconductor structure and a method of the same.

2. Description of Related Art

In recent, in order to cost down for raising the competitiveness, the "P-field mask" which can prevent leakage current under field oxide from metal routing on field oxide with voltage potential (in other words, for channel stop) is be skipped, and it replace by combining with another mask P-Well for NMOS. Channel stop may be p-type doping layer (by using the P-field mask) underneath oxide pad in LOCOS isolation scheme in CMOS devices; put in place to prevent formation of an inversion layer which would create a conductive channel between PMOS and NMOS parts of the CMOS cell. Therefore, the higher concentration of P-well will lower leakage current, but lower the breakdown voltage.

SUMMARY OF THE INVENTION

Accordingly, the present invention is directed to a semiconductor structure. The semiconductor structure includes at least a substrate with a first conductive type, an isolated structure, a gate, a deep well with a second conductive type, a body well with the first conductive type, and a source and a drain with the second conductive type. The isolated structure is formed in the substrate to define an active region. The gate is formed in the active region on the substrate. The deep well is formed in the active region of the substrate and extending under the isolated structure. The body well is formed in the deep well between the gate and the isolated structure, wherein the body well has a convex region extending under the isolated structure. The drain is formed in the deep well at one side of the gate, and the source is formed in the body well at the other side of the gate. The deep well has a drive-in region outside the convex region of the body well, and the drive-in region has a lower doping concentration than remainder of the deep well.

The present invention is further directed to a method of manufacturing a semiconductor structure. In the method, a substrate is provided, and a deep doping region is formed, wherein an undoped region is located within the deep doping region. A drive-in process is then performed on the deep doping region to form a deep well and transform the undoped region into a drive-in region. A body well is formed in the deep well, wherein the body well has a convex region close to the drive-in region. An isolated structure is formed in the substrate to define an active region, wherein the isolated structure is over the convex region and the drive-in region. A gate is formed in the active region on the substrate at an interface between the deep well and the body well. A source and a drain are formed at two sides of the gate in the body well and the deep well respectively.

According to the present disclosure, a drive-in region is designed to be outside the convex region of the body well. Therefore, the leakage current under the isolated structure from metal routing on the isolated structure can be prevented by the convex region, and the breakdown voltage can be increased by the drive-in region outside the convex region. Accordingly, both breakdown and stability of the semiconductor structure are improved.

A detailed description is given in the following embodiments with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
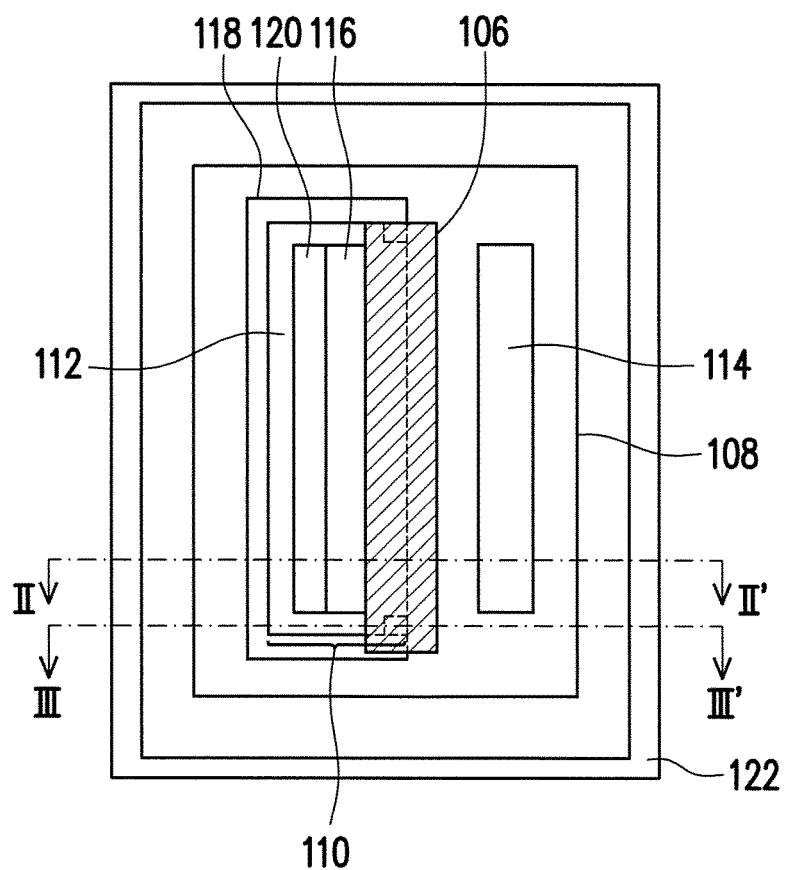
FIG. 1 is a top-view diagram of a semiconductor structure in accordance with a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
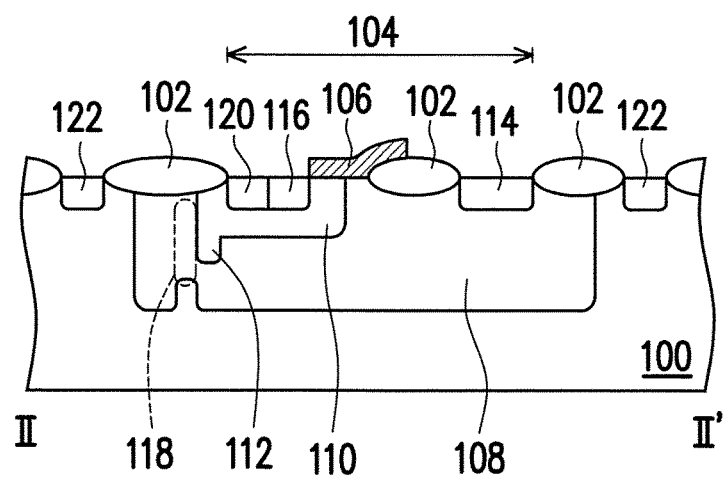
FIG. 2 is a schematic, cross-sectional diagram of the semiconductor structure of FIG. 1 along the line II-II'.

FIG. 1 is a top-view diagram of a semiconductor structure in accordance with a first embodiment of this invention. FIG. 2 is a schematic, cross-sectional diagram of the semiconductor structure of FIG. 1 along the line FIG. 3 is a schematic, cross-sectional diagram of the semiconductor structure of FIG. 1 along the line III-III'.

Figure 3:
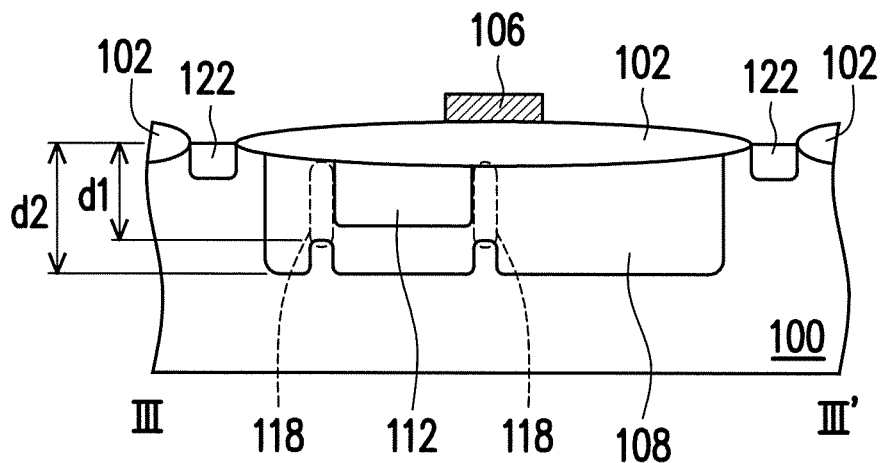
FIG. 3 is a schematic, cross-sectional diagram of the semiconductor structure of FIG. 1 along the line III-III'.

In FIGS. 1-3, the semiconductor structure includes at least a substrate 100 with a first conductive type, an isolated structure 102 for defining an active region 104 in the substrate 100, a gate 106, a deep well 108 with a second conductive type, a body well 110 with the first conductive type, and a source 116 and a drain 114 with the second conductive type. The first conductive type is n type, and the second conductive type is p type. Alternatively, the first conductive type is p type, and the second conductive type is n type. In other words, the semiconductor structure of FIG. 1 may be a NMOS, a PMOS, or a combination thereof. In one embodiment, the semiconductor structure may be an iso-ED (extended drain) NMOS, an ED PMOS, a LD (lateral diffused) N/P MOS, a LDD N/P MOS, a BJT, diode, etc.

For clarify, the isolated structure 102 only shows in the cross-sectional diagram of FIGS. 2 and 3. The isolated structure 102 is, for example, field oxide, shallow trench isolation, or dielectric structure. The gate 106 is formed in the active region 104 on the substrate 100. The deep well 108 is formed in the active region 104 of the substrate 100 and extending under the isolated structure 102. The body well 110 is formed in the deep well 108 between the gate 106 and the isolated structure 102, wherein the body well 110 has a convex region 112 extending under the isolated structure 102. The convex region 112 may function as a channel stop to prevent formation of an inversion layer which would create a conductive channel between PMOS and NMOS of a CMOS cell, and thus the higher the doping concentration of the convex region 112 is, the lower the leakage current occurs. The convex region 112 has a higher doping concentration than remainder of the body well 110 in one embodiment. The drain 114 is formed in the deep well 108 at one side of the gate 106, and the source 116 is formed in the body well 110 at the other side of the gate 106. The isolated structure 102 may be further formed between the gate 106 and the drain 114 to act as a drift region for LD-MOS (Lateral double-Diffused MOSFET) or ED-MOS (Lateral Extended Drain MOSFET), so that the breakdown voltage can be increased by the drift region.

In FIGS. 2 and 3, the deep well 108 has a drive-in region 118 outside the convex region 112 of the body well 110, and the drive-in region 118 has a lower doping concentration than remainder of the deep well 108. Since the doping concentration of the drive-in region 118 is low, the junction breakdown in the drive-in region 118 is high, whereby increasing the breakdown voltage herein. The drive-in region 118 is preferably disposed around the entire convex region 112 as shown in FIG. 1. The depth d1 of the drive-in region 118 is, for example, shallower than the depth d2 of the remainder of the deep well 108. Moreover, a doping region 120 with the first conductive type may be disposed between the source 116 and the convex region 112 of the body well 110, and it can provide the ohmic contact for the body well 110. The convex region 112 may be formed between the isolated structure 102 and the doping region 120. In addition, a P-sub region 122 is surround the deep well 108 and may be grounded.

Figure 4:
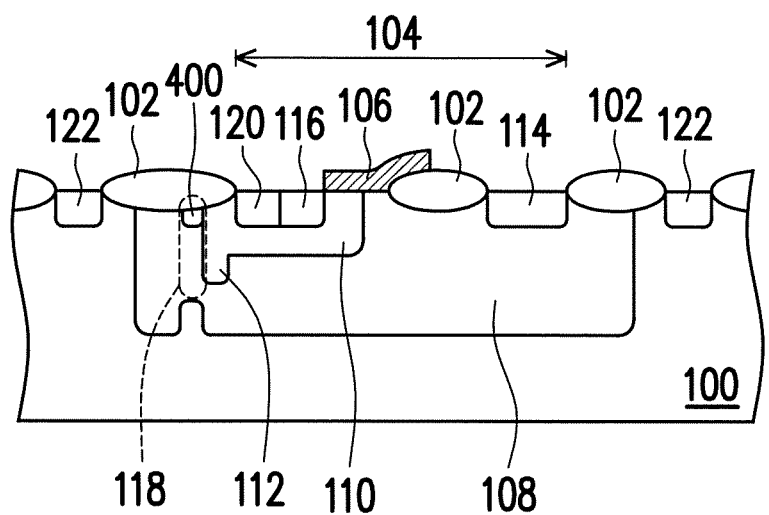
FIG. 4 is a schematic, cross-sectional diagram of the semiconductor structure in accordance with a second embodiment of this invention.

FIG. 4 is a schematic, cross-sectional diagram of the semiconductor structure in accordance with a second embodiment of this invention, wherein the component notations the same as FIG. 2 are used to represent the same or similar components.

In FIG. 4, a doping region 400 with the first conductive type is formed close to the convex region 112 of the body well 110 in the drive-in region 118 of the deep well 108, and the doping region 400 may have a lower doping concentration than the body well 110. For example, if the body well 110 is a p type well, then the doping region 400 may be a p-region. The doping region 400 may be implanted into the drive-in region 118 directly without subsequent thermal process, and thus dopants in the doping region 400 have no strong thermal budget. Accordingly, in comparison with the semiconductor structure of FIG. 2, the uniformity for entire substrate 100 may be improved after forming the doping region 400.

FIGS. 5A to 5G are cross-sectional diagrams of a manufacturing process of a semiconductor structure in accordance with a third embodiment of this invention.

Figure 5A:
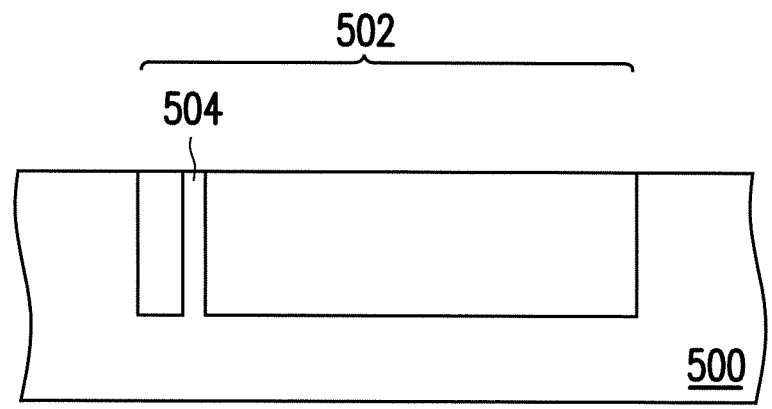
FIGS. 5A to 5G are cross-sectional diagrams of a manufacturing process of a semiconductor structure in accordance with a third embodiment of this invention.
Figure 6A:
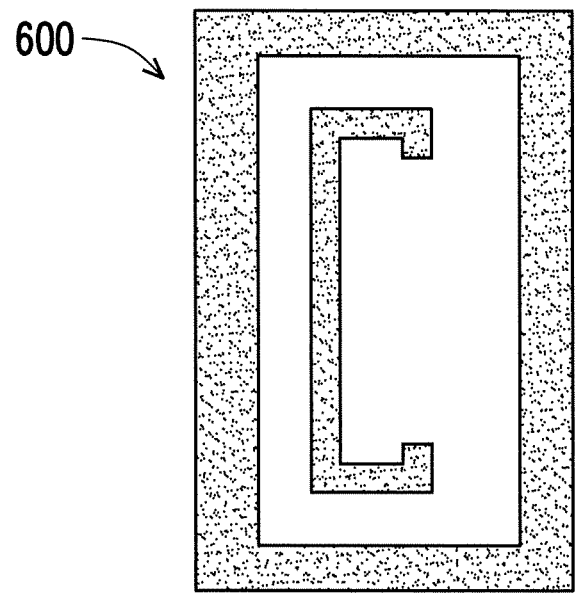
FIG. 6A is a plane diagram of a photomask for the step of FIG. 5A.

With reference to FIG. 5A, a substrate 500 is provided, and a deep doping region 502 is formed, wherein an undoped region 504 is located within the deep doping region 502. FIG. 6A is a plane diagram of a photomask 600 for the step of FIG. 5A, wherein the blank region is corresponded to the deep doping region 502, and the inverted C region is corresponded to the undoped region 504.

Figure 5B:
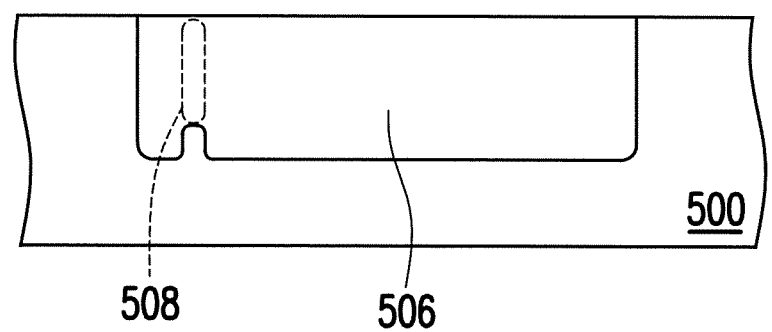

Next, referring to FIG. 5B, a drive-in process is then performed on the deep doping region to form a deep well 506 and transform the undoped region into a drive-in region 508. The drive-in region 508 has a lower doping concentration than remainder of the deep well 506.

Figure 5C:
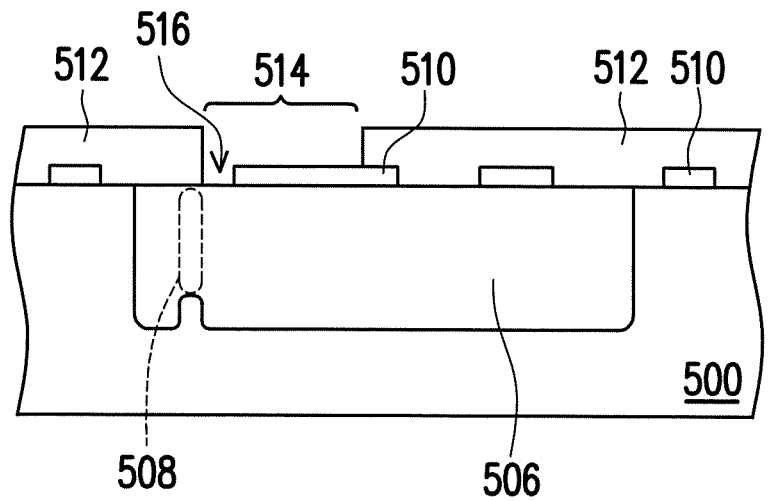
Figure 6B:
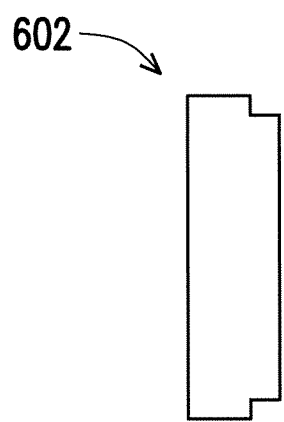
FIG. 6B is a plane diagram of a photomask for the step of FIG. 5C.

Then, referring to FIG. 5C, a hard mask 510 and a photoresist film 512 are orderly formed on the substrate 500 for forming a body well. In detail, the hard mask 510 is formed to cover the active region, and then the photoresist film 512 is coated and patterned to expose a portion of the hard mask 510 and a portion 516 of the substrate 500. FIG. 6B is a plane diagram of a photomask 602 for the step of FIG. 5C, wherein the profile of the photomask 602 is corresponded to a region 514, and the body well would be formed in the deep well 506 below the region 514.

Figure 5D:
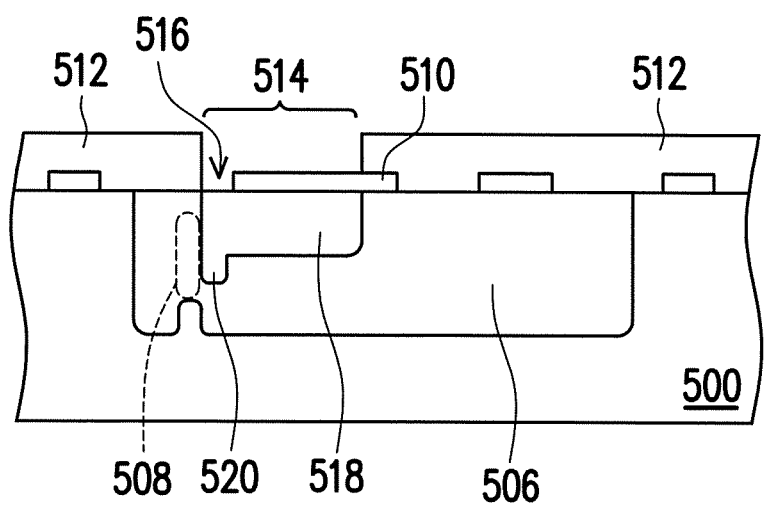

Then, referring to FIG. 5D, a twice implantation may be performed to form a shallow doping region (not shown) in the exposed portion 516 of substrate 500 in a first step and then form a deep doping region (not shown) below the region 514 in a second, and thus a doping energy of the second step may higher than that of the first step. After thermal process, a body well 518 is formed in the deep well 506, wherein the body well 518 has a convex region 520 close to the drive-in region 508. The convex region 520 is formed from above two doping regions (i.e. the shallow doping region and the deep doping region), and thus it has a higher doping concentration than remainder of the body well 518.

Figure 5E:
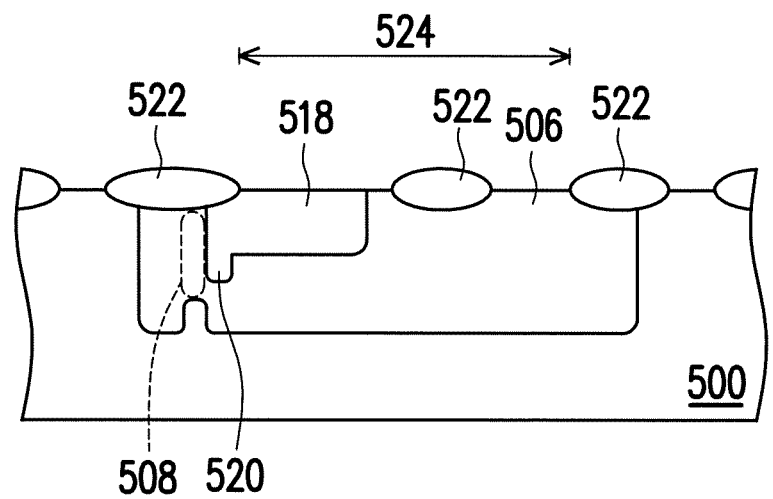

Then, referring to FIG. 5E, after removing the photoresist film 512, an isolated structure 522 is formed in the substrate 500 to define an active region 524, wherein the isolated structure 522 is over the convex region 520 and the drive-in region 508. In the embodiment, the isolated structure 522 is field oxide (FOX), but it is not limited thereto. In other embodiments, the isolated structure 522 may be shallow trench isolation or dielectric structure. Afterwards, the hard mask 510 is removed.

Figure 5F:
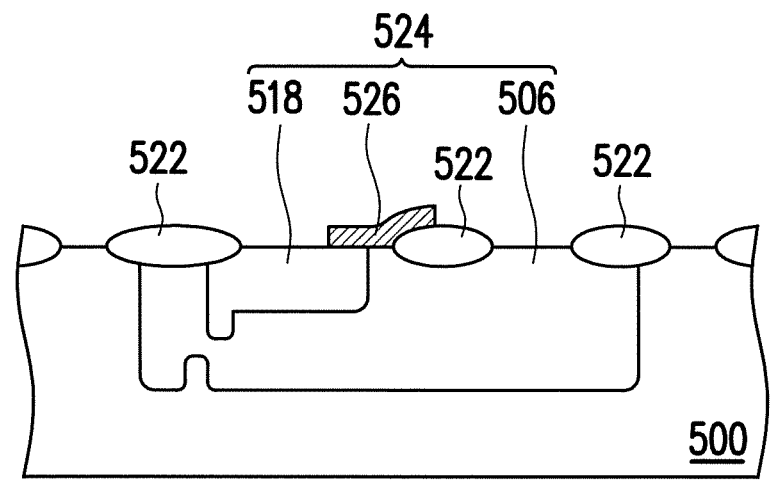

Next, referring to FIG. 5F, a gate 526 is formed in the active region 524 on the substrate 500 at an interface between the deep well 506 and the body well 518.

Figure 5G:
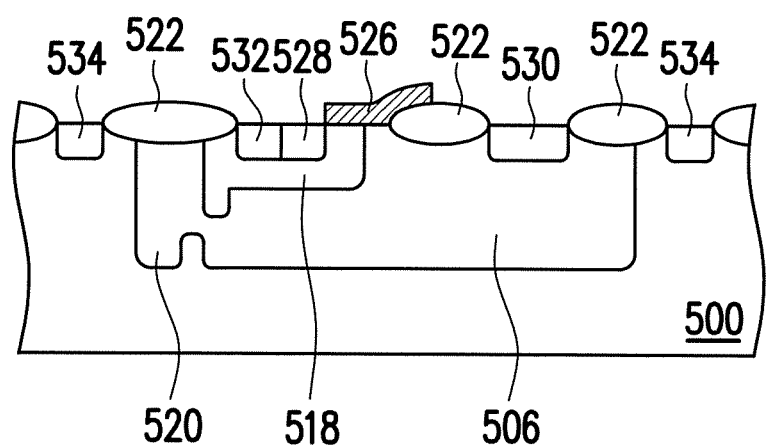

Then, referring to FIG. 5G, a source 528 and a drain 530 are formed at two sides of the gate 526 in the body well 518 and the deep well 506 respectively. In one embodiment, a doping region 532 (called body or bulk terminals generally) is further formed between the source 528 and the convex region 520, and the doping region 532 has the same conductive type as the body well 518. Moreover, a P-sub region 534 surround the deep well 108 may be formed.

Figure 7A:
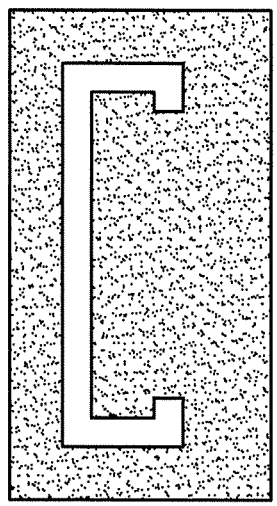
FIG. 7A is a plane diagram of a photomask for the step after FIG. 5B.
Figure 7B:
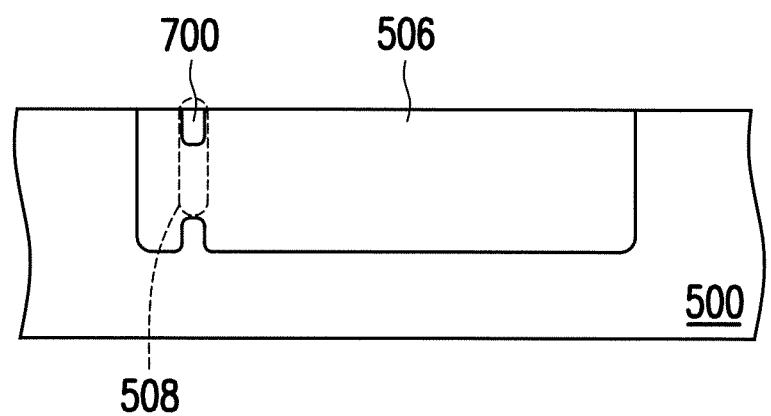
FIG. 7B is a cross-sectional diagram of the substrate by using the mask of FIG. 7A.

FIG. 7A is a plane diagram of a photomask for the step after FIG. 5B. FIG. 7B is a cross-sectional diagram of the substrate by using the mask of FIG. 7A.

With reference to FIGS. 7A and 7B, after the drive-in process in FIG. 5B, the drive-in region 508 is already formed. Then, a doping region 700 is formed in the drive-in region 508 of the deep well 506, and the doping region 700 has different conductive type from the deep well 506. Therefore, after performing subsequent steps of FIGS. 5C-5G, the doping region 700 would be close to the convex region of the body well and has the same conductive type as the body well.

To verify the effect of the invention, exemplary examples will be described in detail so as to be easily realized by a person having ordinary knowledge in the art. Furthermore, the invention is not limited to any of the following experimental examples.

Examples 1-2

Figure 8:
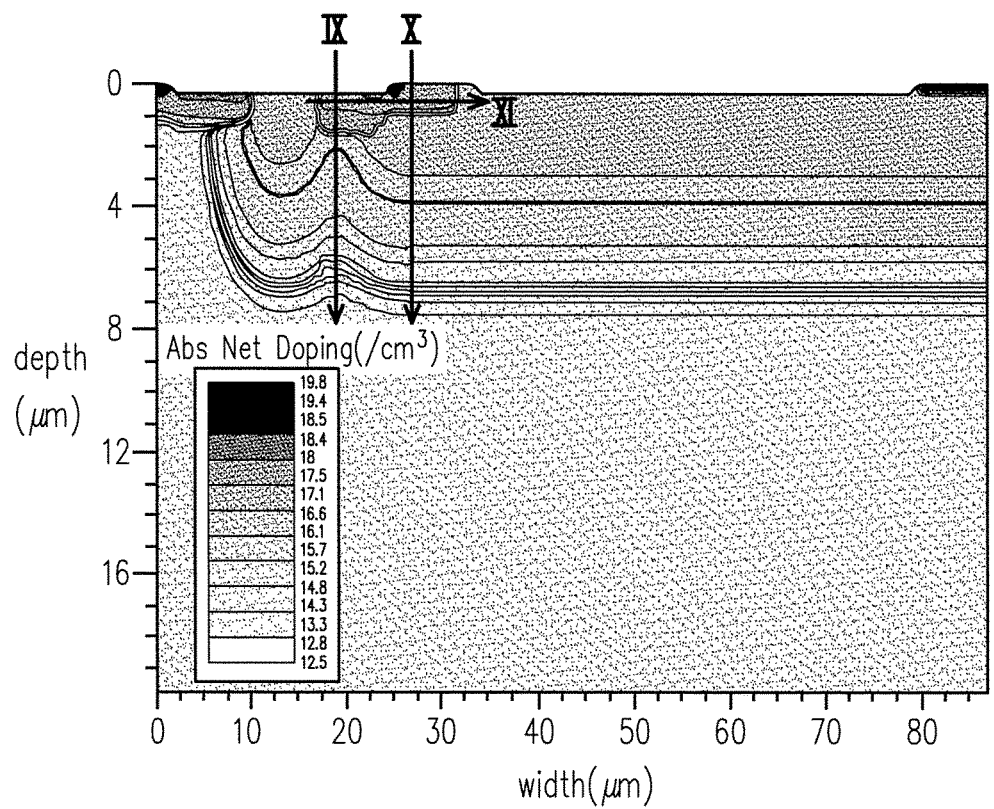
FIG. 8 is a simulation of the junction profile in the substrate of Example 2 of this invention.

A semiconductor structure of FIG. 2 is manufactured as example 1. A semiconductor structure of FIG. 4 is manufactured as example 2. FIG. 8 is a simulation of the junction profile in the substrate of Example 2. The difference between Examples 1 and 2 is that Example 1 is without the doping region 400 in FIG. 4 (i.e. the p-region), but Example 2 has the p-region.

Figure 9:
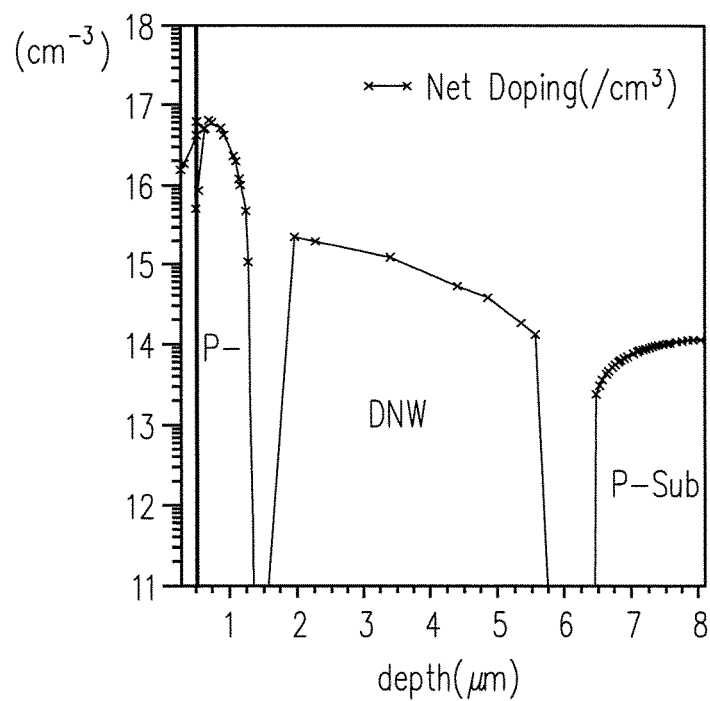
FIG. 9 is a curve diagram of the doping concentration in FIG. 8 along the line IX.
Figure 10:
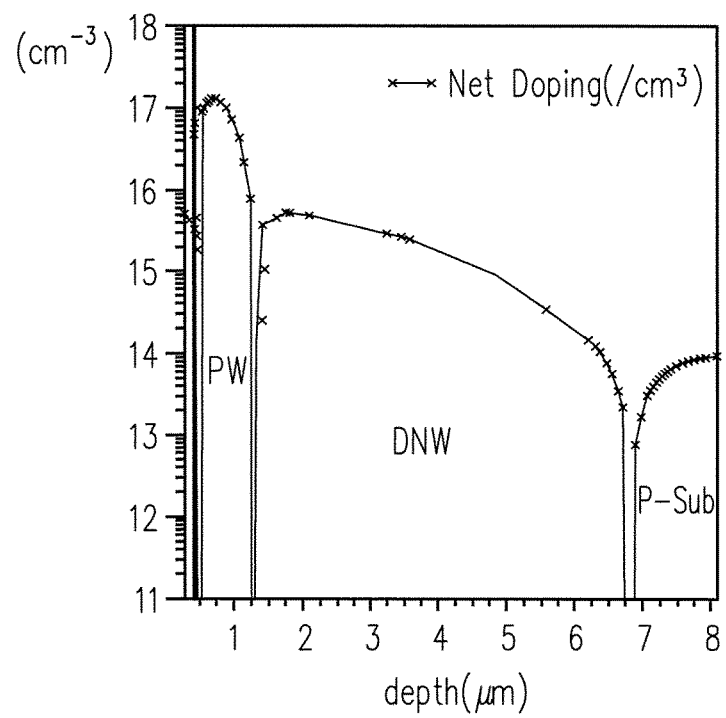
FIG. 10 is a curve diagram of the doping concentration in FIG. 8 along the line X.
Figure 11:
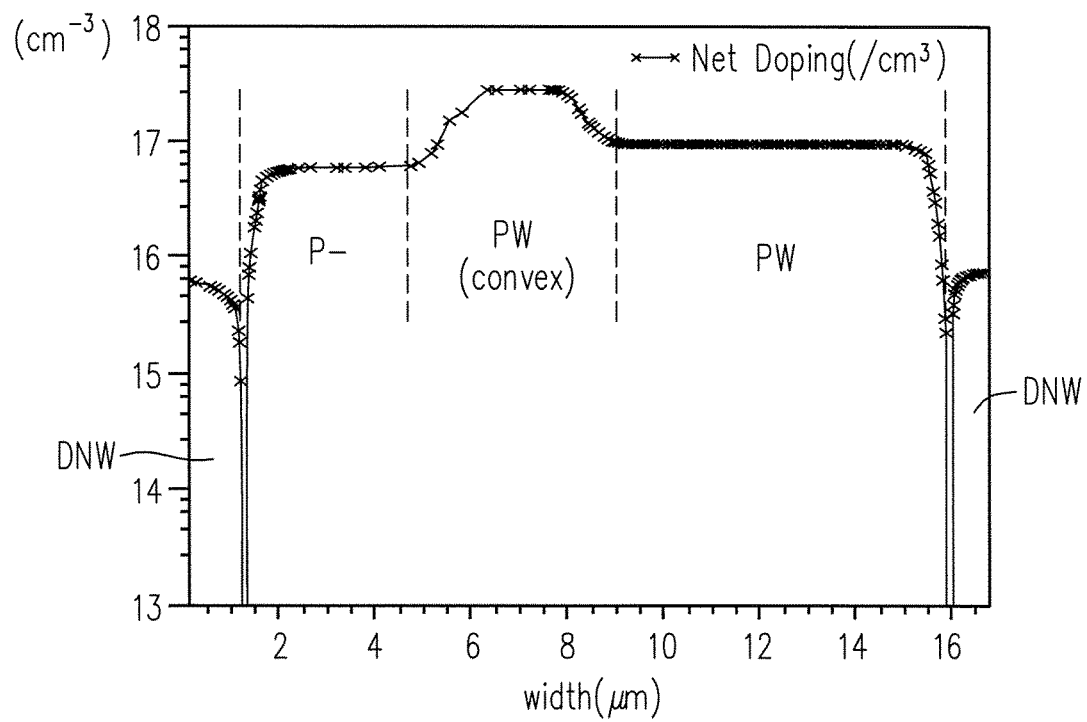
FIG. 11 is a curve diagram of the doping concentration in FIG. 8 along the line XI.

FIG. 9 is a curve diagram of the doping concentration in FIG. 8 along the line IX. FIG. 10 is a curve diagram of the doping concentration in FIG. 8 along the line X. FIG. 11 is a curve diagram of the doping concentration in FIG. 8 along the line XI. In FIGS. 9-11, p-represents the p-region, DNW represents deep (N) well, P-sub represents the (p type) substrate, and PW represents body (p type) well.

Comparison Example

A semiconductor structure is manufactured as comparison example. The semiconductor structure of comparison example is similar to FIG. 2, but it is without the drive-in region.

Test

The electrical testing is performed in Examples 1-2 and Comparison example. The experimental data (not simulation) are shown in Table 1 below.

TABLE 1

| | Vt | Idsat | $V_{BD}$ (V) | | |
|---|---|---|---|---|---|
| | (V) Mean | (mA) Mean | Mean | Standard Deviation | Range |
| Comparison example | 0.81 | 3.28 | 60.14 | 3.13 | 7.99 |
| Example 1 | 0.81 | 3.40 | 63.02 | 1.72 | 4.83 |
| Example 2 | 0.81 | 3.40 | 69.39 | 0.70 | 1.57 |

In Table 1, Vt represents threshold voltage, and it was extracted by max gm method. Idsat represents the drain current at saturation region (e.g.: Vd=30V, Vg=30V). $V_{BD}$ represents Off breakdown voltage (e.g.: Vg=0V, the voltage when Vd sweep to Id=1 μA). The standard deviation is a measure to quantify the amount of variation or dispersion of a set of data values. "Range" means the maximum value minus the minimum value. "Mean" is an average of five sites, the data is shown as table 2 below.

It can be seen that the breakdown voltage can be improved about 3V in example 1, and it is better in example 2 with the p-region.

TABLE 2

| | $V_{BD}$ of five sites | | | | |
|---|---|---|---|---|---|
| | Center | Down | Left | Up | Right |
| Comparison example | 56.77 | 59.85 | 64.76 | 57.93 | 61.38 |
| Example 1 | 65.68 | 62.76 | 62.83 | 60.85 | 62.97 |
| Example 2 | 68.73 | 68.58 | 70.15 | 69.61 | 69.86 |

It can be seen in table 2 that the uniformity of comparison example is poor, and the uniformity of Example 2 is better than that of Example 1. The reason why example 2 has better uniformity suspects that DNW is not uniform for entire wafer. It is because the DNW is formed by long time thermal process to diffuse impurities, but in example 2, the p-region is formed directly without thermal process, so dopants have no strong thermal budget.

In summary, this invention provides a drive-in region outside the convex region of the body well, and thus the leakage current under the isolated structure from metal routing on the isolated structure can be prevented, and the breakdown voltage can be increased by the drive-in region outside the convex region. Therefore, both breakdown and stability of the semiconductor structure are improved. Moreover, a doping region is formed close to the convex region of the body well in the drive-in region of the deep well, and thus the uniformity for entire structure may be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure, comprising:
   a substrate with a first conductive type;
   an isolated structure formed in the substrate to define an active region;
   a gate formed in the active region on the substrate;
   a deep well with a second conductive type formed in the active region of the substrate and extending under the isolated structure;
   a body well with the first conductive type formed in the deep well between the gate and the isolated structure, wherein the body well has a convex region extending under the isolated structure;
   a drain with the second conductive type formed in the deep well at one side of the gate; and
   a source with the second conductive type formed in the body well at the other side of the gate,
   wherein the deep well has a drive-in region outside the convex region of the body well, and the drive-in region has a lower doping concentration than remainder of the deep well.

2. The semiconductor structure as claimed in claim 1, further comprising a first doping region with the first conductive type close to the convex region of the body well in the drive-in region of the deep well, and the first doping region has a lower doping concentration than the body well.

3. The semiconductor structure as claimed in claim 1, wherein the first conductive type is n type, and the second conductive type is p type.

4. The semiconductor structure as claimed in claim 1, wherein the first conductive type is p type, and the second conductive type is n type.

5. The semiconductor structure as claimed in claim 1, further comprising a second doping region with the first conductive type between the source and the convex region of the body well.

6. The semiconductor structure as claimed in claim 5, wherein the convex region is formed between the isolated structure and the second doping region.

7. The semiconductor structure as claimed in claim 1, wherein the isolated structure is field oxide, shallow trench isolation, or dielectric structure.

8. The semiconductor structure as claimed in claim 1, wherein the isolated structure is further formed between the gate and the drain.

9. The semiconductor structure as claimed in claim 1, wherein the convex region has a higher doping concentration than remainder of the body well.

10. The semiconductor structure as claimed in claim 1, wherein a depth of the drive-in region is shallower than that of the remainder of the deep well.

11. The semiconductor structure as claimed in claim 1, wherein the drive-in region is disposed around the entire convex region.

* * * * *